(12) United States Patent
Zievers

(10) Patent No.: US 9,495,310 B2
(45) Date of Patent: Nov. 15, 2016

(54) COMPUTING SYSTEM WITH HARDWARE BUS MANAGEMENT AND METHOD OF OPERATION THEREOF

(71) Applicant: Xcelemor, Inc., Livermore, CA (US)

(72) Inventor: Peter J. Zievers, Naperville, IL (US)

(73) Assignee: Xcelemor, Inc., Livermore, CA (US)

( * ) Notice: Subject to any disclaimer, the term of this patent is extended or adjusted under 35 U.S.C. 154(b) by 3 days.

(21) Appl. No.: 14/702,527

(22) Filed: May 1, 2015

(65) Prior Publication Data

US 2015/0234755 A1 Aug. 20, 2015

Related U.S. Application Data

(63) Continuation of application No. 13/465,955, filed on May 7, 2012, now Pat. No. 9,053,266.

(60) Provisional application No. 61/483,523, filed on May 6, 2011.

(51) Int. Cl.
*G06F 17/50* (2006.01)
*G06F 13/16* (2006.01)
(Continued)

(52) U.S. Cl.
CPC ....... *G06F 13/1689* (2013.01); *G06F 11/1458* (2013.01); *G06F 13/1694* (2013.01);
(Continued)

(58) Field of Classification Search
CPC ............. G06F 17/5027; G06F 15/177; G06F 17/5054; G06F 17/5022; G06F 11/261; G06F 11/3656; G06F 11/349; G06F 1/1458; G06F 13/14; G06F 13/4022; G06F 13/4004; G06F 13/1689; G06F 13/1694; G06F 15/7867; G06F 15/173; G06F 2201/84
See application file for complete search history.

(56) References Cited

U.S. PATENT DOCUMENTS 5,761,484 A 6/1998 Agarwal et al.
5,838,908 A 11/1998 Matzke et al.
(Continued)

FOREIGN PATENT DOCUMENTS

EP 0410502 1/1991

OTHER PUBLICATIONS

Babb et al., "Virtual Wires: Overcoming Pin Limitations in FPGA-based Logic Emulators", p. 10, Publisher: MIT Laboratory for Computer Science, Published in: Cambridge, US.
(Continued)

*Primary Examiner* — Helen Rossoshek
(74) *Attorney, Agent, or Firm* — Wong & Rees LLP

(57) ABSTRACT

A method of operation of a computing system includes: reconfigurable hardware devices having first application fragment and second application fragment; configuring virtual bus module having virtual bus for electrically coupling the reconfigurable hardware devices; allocating a physical port in the virtual bus, based on availability, for coupling the first application fragment and the second application fragment through the virtual bus; implementing an application through the virtual bus including transferring application data between the first application fragment and the second application fragment; activating a signal buffer interface by the virtual bus module: activating a pin buffer dispatch module for storing the application data from application input buffer, and activating memory request port by roll-back table module, storing the application data, in response to the pin buffer dispatch module; and alerting a roll-back detector including dismissing the application data exceeds a roll-back threshold or restoring memory interface module by the roll-back module.

10 Claims, 9 Drawing Sheets

(51) Int. Cl.
*G06F 11/14* (2006.01)
*G06F 13/40* (2006.01)

(52) U.S. Cl.
CPC ....... *G06F13/4022* (2013.01); *G06F 17/5022* (2013.01); *G06F 17/5027* (2013.01); *G06F 17/5054* (2013.01); *G06F 2201/84* (2013.01)

(56) References Cited

U.S. PATENT DOCUMENTS

| | | |
|---|---|---|
| 5,850,537 A | 12/1998 | Selvidge et al. |
| 6,292,916 B1 | 9/2001 | Abramovici et al. |
| 6,421,817 B1 | 7/2002 | Mohan et al. |
| 6,434,687 B1 | 8/2002 | Huppenthal |
| 6,442,732 B1 | 8/2002 | Abramovici et al. |
| 6,470,415 B1 | 10/2002 | Starr et al. |
| 6,697,868 B2 | 2/2004 | Craft et al. |
| 6,751,723 B1 | 6/2004 | Kundu et al. |
| 6,941,539 B2 | 9/2005 | Hammes |
| 6,964,029 B2 | 11/2005 | Poznanovic et al. |
| 7,013,449 B2 | 3/2006 | Schlansker et al. |
| 7,047,464 B2 | 5/2006 | Bailis et al. |
| 7,069,419 B2 | 6/2006 | Kundu et al. |
| 7,120,571 B2 | 10/2006 | Shei et al. |
| 7,120,706 B2 | 10/2006 | Zievers |
| 7,159,049 B2 | 1/2007 | Zievers |
| 7,162,551 B2 | 1/2007 | Zievers |
| 7,366,652 B2 | 4/2008 | Wang et al. |
| 7,379,859 B2 | 5/2008 | Goode |
| 7,454,658 B1 | 11/2008 | Baxter |
| 7,539,610 B2 | 5/2009 | Imada et al. |
| 7,571,414 B2 | 8/2009 | Huang et al. |
| 7,664,931 B2 | 2/2010 | Erforth et al. |
| 7,739,097 B2 | 6/2010 | Sample et al. |
| 8,756,548 B2 | 6/2014 | Zievers |
| 8,868,894 B2 * | 10/2014 | Zievers ................ G06F 15/781 712/15 |
| 8,869,087 B2 * | 10/2014 | Zievers ................ G06F 15/781 716/117 |
| 9,055,069 B2 * | 6/2015 | Zievers ................ G06F 9/545 |
| 9,055,070 B2 * | 6/2015 | Zievers ................ G06F 9/545 |
| 9,152,748 B2 * | 10/2015 | Zievers ................ G06F 15/781 |
| 2001/0056558 A1 | 12/2001 | Couts-Martin et al. |
| 2002/0072893 A1 | 6/2002 | Wilson |
| 2003/0037178 A1 | 2/2003 | Vessey et al. |
| 2010/0274550 A1* | 10/2010 | Chou ................ G06F 17/5027 703/21 |
| 2011/0145447 A1 | 6/2011 | Dimond |
| 2011/0302231 A1 | 12/2011 | Huggett et al. |
| 2012/0284379 A1 | 11/2012 | Zievers |
| 2012/0284438 A1 | 11/2012 | Zievers |
| 2012/0284492 A1 | 11/2012 | Zievers |
| 2012/0284501 A1 | 11/2012 | Zievers |
| 2012/0284502 A1 | 11/2012 | Zievers |
| 2013/0346639 A1* | 12/2013 | Stroud ................ G06F 13/4004 710/14 |

OTHER PUBLICATIONS

Becker et al., "Dynamic and Partial FPGA Exploitation", "IEEE", Feb. 2007, pp. 438-452, vol. 95, No. 2, Publisher: Proceedings of the IEEE.

Compton et al., "An Introduction to Reconfigurable Computing", p. 9, Publisher: Northwestern University, Published in: Evanston, US.

Gomez-Prado et al., "A Tutorial on FPGA Routing", p. 16, Publisher: Department of Electrical and Computer Engineering. University of Massachusetts, Published in: Amherst, US.

Nygren et al., "Virtual Communication Bus with Hardware and Software Tasks in Real-Time System", 2000, p. 3 pgs, Publisher: Malardalens University, MRTC.

Shobaki, "On-Chip Monitoring for Non-Intrusive Hardware/Software Observability", "IT Licentiante Theses", Sep. 2004, p. 167 pages, Publisher: Uppsala University, Dept of IT, Malardalen Real-Time Research Center, Published in: Sweden.

Todman et al., "Reconfigurable computing: architectures and design methods", "IEE Proc.-Comput. Digit. Tech., vol. 152, No. 2, Mar. 2005", Mar. 2005, p. 15 Publisher: IEEE.

Vancourt et al., "Sizing of Processing Arrays for FPGA-Based Computation", p. 6, Publisher: Boston University, Department of Electrical and Computer Engineering, Published in: Boston, US.

* cited by examiner

COMPUTING SYSTEM WITH HARDWARE BUS MANAGEMENT AND METHOD OF OPERATION THEREOF

CROSS-REFERENCE TO RELATED APPLICATION

This is a continuation of co-pending U.S. patent application Ser. No. 13/465,955 filed May 7, 2012, which claims the benefit of U.S. Provisional Patent Application Ser. No. 61/483,523 filed May 6, 2011, and the subject matter thereof is incorporated herein by reference thereto.

TECHNICAL FIELD

The present invention relates generally to a computing system and more particularly to a computing system with hardware bus management.

BACKGROUND ART

Electronic hardware with integrated circuits is used in virtually all electronic equipment today and has revolutionized the world of electronics. The integrated circuits are used in digital electronic systems, such as computers, televisions, cellular phones, mobile devices, and digital video cameras.

Typically, a general purpose computer architecture is provided that can be exercised by software, which is loaded in a supporting memory system, to enable a specific function. This combination allows a broad range of flexibility but trades performance and security. The flexibility of the system also provides a path for compromising the integrity of the application performed.

The integrated circuits, that enable virtually every electronics gadget used on a daily basis, are constantly being improved by the semiconductor industry. However, pure hardware implementation does not allow the flexibility to address the myriad of applications in modern electronic systems.

Thus, a need still remains for computing systems that provide flexibility of functions while delivering increased performance and improved security. In view of the increasing demand for computing systems with improved integration and performance, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of operation of a computing system including: providing reconfigurable hardware devices having a first application fragment and a second application fragment; configuring a virtual bus module having a virtual bus for coupling the reconfigurable hardware devices; allocating a physical port in the virtual bus, based on availability, for communicatively coupling the first application fragment and the second application fragment through the virtual bus; and implementing an application through the virtual bus including transferring application data between the first application fragment and the second application fragment.

The present invention provides a computing system including: reconfigurable hardware devices, having a first application fragment and a second application fragment, mounted on a circuit board; a virtual bus module having a virtual bus electrically coupled to the reconfigurable hardware devices; and physical conductors between the reconfigurable hardware devices and the virtual bus.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The term "module" referred to herein includes hardware in the present invention in accordance with the context in which the term is used. For example, the hardware can include circuitry, programmable circuitry, computer, integrated circuit, integrated circuit cores, a pressure sensor, an inertial sensor, a microelectromechanical system (MEMS), passive devices, or a combination thereof.

Figure 1:
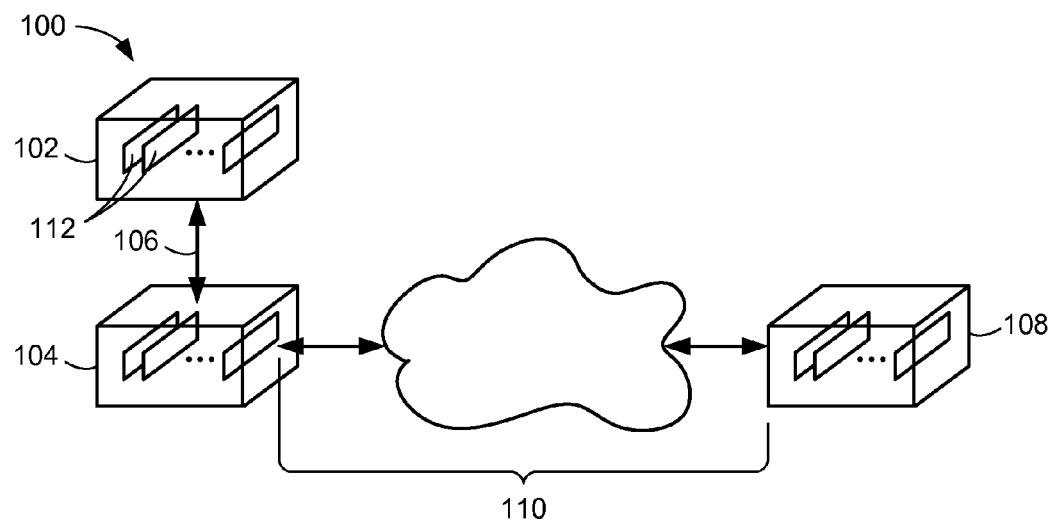
FIG. 1 is a computing system with data and control planes in an embodiment of the present invention.

Referring now to FIG. 1, therein is shown a computing system 100 with data and control planes in an embodiment of the present invention. The computing system 100 can represent an adaptive architecture execution environment (AAXE), which is a scalable hardware operating system that can be used to run applications by executing their commands in pre-configured hardware.

The computing system 100 can include a first electronic equipment 102 connected to a second electronic equipment 104 through a first communication path 106. The computing system 100 can include a third electronic equipment 108 connected to the second electronic equipment 104 through a second communication path 110.

For example, the first electronic equipment 102, the second electronic equipment 104, or the third electronic equipment 108 can represent a stationary device or a mobile device. As specific examples, the first electronic equipment 102, the second electronic equipment 104, or the third electronic equipment 108 can be a server, a server farm, a computer, a grid-computing resource, a virtualized computer resource, a cloud computing resource, a router, a switch, a peer-to-peer distributed computing device, a network equipment, a storage enclosure, or a combination thereof. As additional specific examples, the first electronic equipment 102, the second electronic equipment 104, or the third electronic equipment 108 can be a cellular phone, a personal digital assistant, a notebook computer, a multi-functional mobile communication device, or an entertainment device.

The first communication path 106, as an example, can represent a wireless network, a wired network, or a combination thereof for box-to-box connectivity. The first communication path 106 can include wireless communication, wired communication, optical, ultrasonic, or a combination thereof. Bluetooth, Infrared Data Association standard (IrDA), wireless fidelity (WiFi), and worldwide interoperability for microwave access (WiMAX) are examples of wireless communication for the first communication path 106. Ethernet, Fiber Channel, and Peripheral Component Interconnect (PCI) are also examples of wired communication for the first communication path 106.

The second communication path 110, for example, can represent a wireless network, a wired network, or a combination thereof for connectivity over a network. The second communication path 110 can include wireless communication, wired communication, optical, ultrasonic, cloud network, or a combination thereof. Satellite communication, cellular communication, Bluetooth, Infrared Data Association standard (IrDA), wireless fidelity (WiFi), and worldwide interoperability for microwave access (WiMAX) are examples of wireless communication for the second communication path 110. Ethernet, digital subscriber line (DSL), fiber to the home (FTTH), and plain old telephone service (POTS) are also examples of wired communication for the second communication path 110.

Further, the second communication path 110 can traverse a number of network topologies and distances. For example, the second communication path 110 can include direct connection, personal area network (PAN), local area network (LAN), metropolitan area network (MAN), wide area network (WAN), or any combination thereof. Also for example, the second communication path 110 can support timing requirements or quality of service (QoS) features.

Each of the first electronic equipment 102, the second electronic equipment 104, and the third electronic equipment 108 can include a number of line cards 112, which are defined as modular electronic sub-systems. The line cards 112 can be connected through a backplane or by cables for inside-a-box connectivity. The line cards 112 can be connected together using connectivity methods including electrical connectors, optical fiber connectors, or wave-guide connectors.

The line cards 112 can include electronic components including an application-specific integrated circuit (ASIC), a field-programmable gate array (FPGA), or a combination thereof. For example, the line cards 112 can represent server blades, expansion cards, or interface cards for routers or switches.

Figure 2:
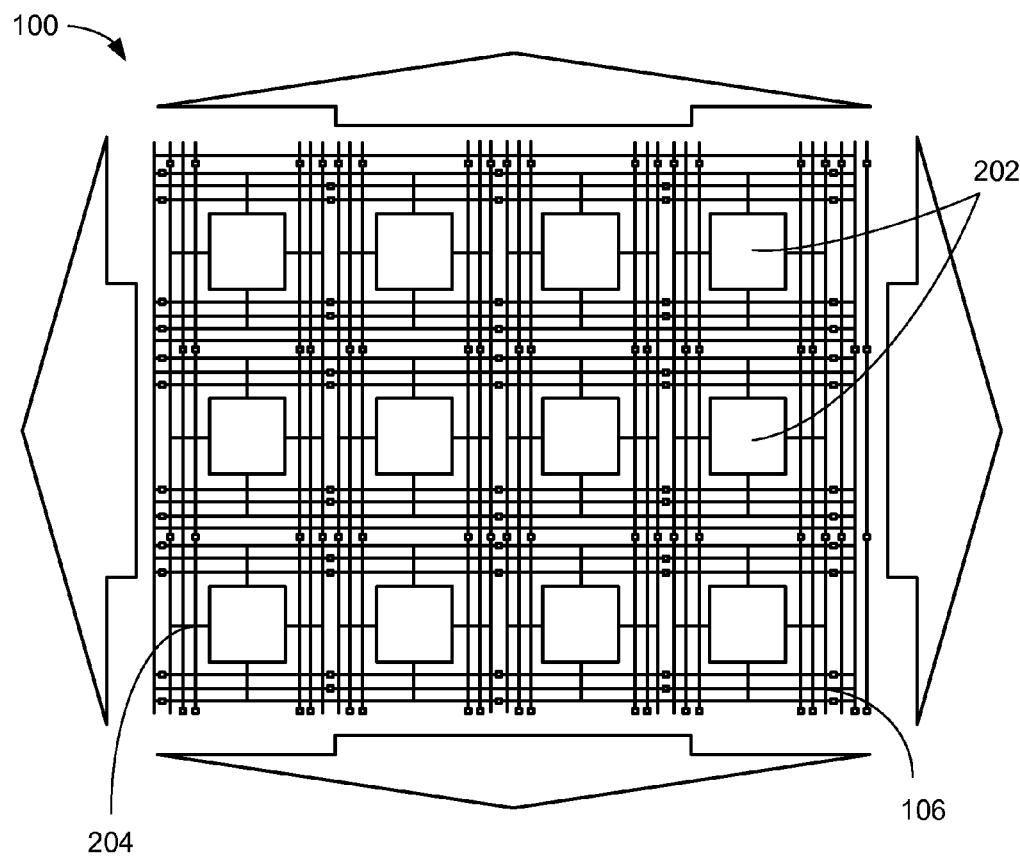
FIG. 2 is an architecture diagram of the computing system.

Referring now to FIG. 2, therein is shown an architecture diagram of the computing system 100. The computing system 100 can include a number of reconfigurable hardware devices 202. The reconfigurable hardware devices 202 are defined as programmable devices in which circuit resources have the functionality of logic gates, storage elements, and interconnections are customizable at run-time or dynamically configured during operation to include or change functions within the programmable devices.

The reconfigurable hardware devices 202 can represent the programmable devices with a configurable pool of programmable blocks and reconfigurable interconnects. For example, the reconfigurable interconnects can represent wires or zero-delay interconnection resources. The architecture diagram depicts arrows to indicate that any number of circuit resources of the reconfigurable hardware devices 202 can be placed, routed, and interconnected.

Placement, routing, and interconnections among a number of the circuit resources of the reconfigurable hardware devices 202 can be configured at run-time. Each of the reconfigurable hardware devices 202 is coupled to physical conductors 204 such as cable interconnects, traces on the line cards 112 of FIG. 1, or wires for forming an electrical communication path. The circuit resources of the reconfigurable hardware devices 202 can be placed and routed, to interconnect or interface between multiple instances of the reconfigurable hardware devices 202, on one or more of the line cards 112 of FIG. 1.

For example, the reconfigurable hardware devices 202 can include field-programmable gate arrays (FPGAs), programmable logic devices (PLDs), or any other programmable hardware devices. Also for example, the reconfigurable hardware devices 202 can represent target programmable devices. Further, for example, interconnections between the reconfigurable hardware devices 202 can represent the first communication path 106 of FIG. 1, the second communication path 110 of FIG. 1, a backplane, or cables for inside-a-box connectivity.

Transparent interconnection of an arbitrary number of the reconfigurable hardware devices 202 can enable scalability. Any delay incurred by traversing the first communication path 106, such as a network, can be regulated by managing the number of hierarchical levels in the first communication path 106 at implementation time, or managing the locality of the application at run time. The first communication path 106 requires management to be effective. Applications can discreetly avail themselves of network management functionality through an abstracted control interface (not shown), leaving complex network maintenance to logic that operates separately from the application.

Figure 3:
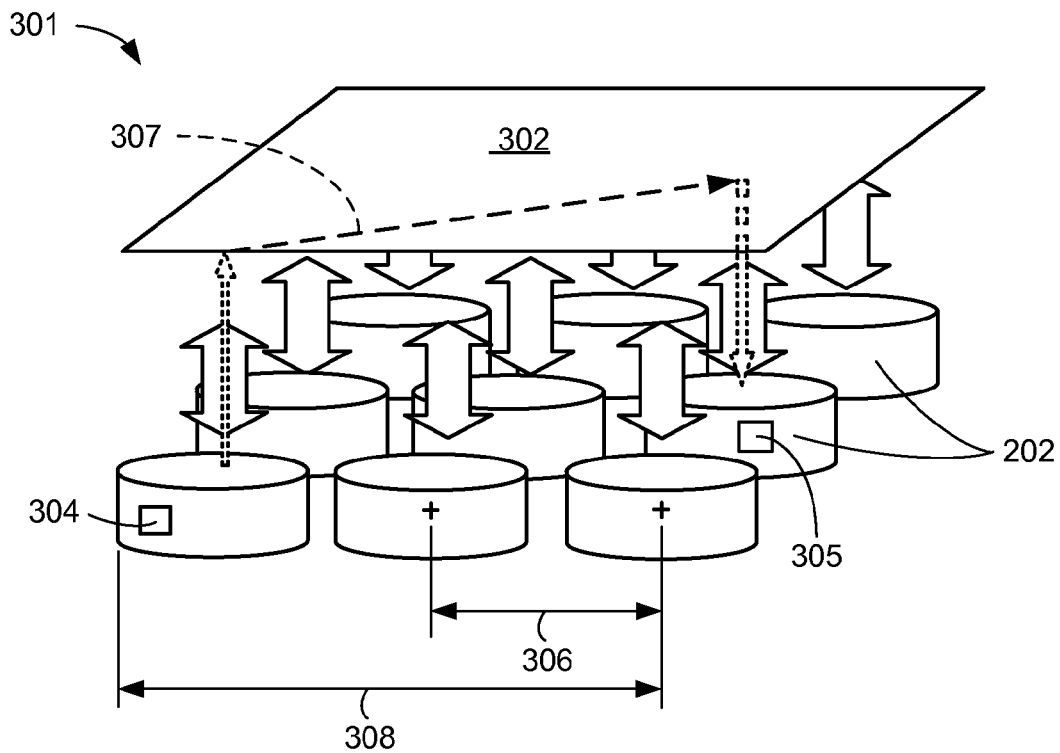
FIG. 3 is a connection diagram of a cross-connection network of the reconfigurable hardware devices.

Referring now to FIG. 3, therein is shown a connection diagram of a cross-connection network 301 of the reconfigurable hardware devices 202. The connection diagram of the cross-connection network 301 depicts a hierarchical connection through a cross-connection structure 302 that enables the reconfigurable hardware devices 202 to communicate between each other. The cross-connection network 301 is defined as a coupling medium for communication, control, and coordination of any attached hardware resources.

One of the reconfigurable hardware devices 202 can interface to another of the reconfigurable hardware devices 202 through the cross-connection structure 302 in a variable path as shown by the dash arrows. For example, the cross-connection structure 302 can include a programmable switched fabric for providing the interconnections between the reconfigurable hardware devices 202.

Any delay incurred by traversing the cross-connection structure 302 can be regulated by managing a number of hierarchical levels constructed in the circuit resources of the reconfigurable hardware devices 202 coupled through the cross-connection structure 302 at implementation time. The implementation time is defined as the time when configuration of the circuit resources of the reconfigurable hardware devices 202 is committed. The hierarchical levels of the cross-connection network 301 can include the reconfigurable hardware devices 202, the line cards 112 of FIG. 1, the second communication path 110 of FIG. 1, or a combination thereof which can be connected through the cross-connection structure 302.

The delay can also be regulated by managing a locality of a first application fragment 304, within the circuit resources of a first instance of the reconfigurable hardware devices 202, relative to a second application fragment 305, in a second instance of the reconfigurable hardware devices 202, at the implementation time. The combination of the first application fragment 304 and the second application fragment 305 can form an application, which is defined as a compute resource for a specific purpose that is to be launched by a user and executed by the circuit resources of the reconfigurable hardware devices 202 in the computing system 100. For illustration purposes, the first instance of the reconfigurable hardware devices 202 is shown to contain the first application fragment 304 and a second instance of the reconfigurable hardware devices 202 is shown to contain the second application fragment 305. It is understood that any number of the first application fragment 304 or the second application fragment 305 can be instantiated across any number of the reconfigurable hardware devices 202 having circuit resources that can be allocated to execute them.

The locality can be provided by mapping the first application fragment 304 to the first instance of the reconfigurable hardware devices 202 and mapping the second application fragment 305 to the second instance of the reconfigurable hardware devices 202 that are within a predetermined distance 306 from each other. The predetermined distance 306 is a distance between centers of the reconfigurable hardware devices 202 that is less than a distance threshold 308 to ensure a propagation delay of less than a fixed numerical value. The distance threshold 308 is a predefined numerical value for determining whether the reconfigurable hardware devices 202 are locally or closely located to each other or whether further synchronization logic is required between the first application fragment 304 and the second application fragment 305.

The cross-connection network 301 can include management functions to be effective. Any number of the first application fragment 304 can discretely operate within the network management functionality through a control interface, leaving complex network maintenance to logic that operates separately from the first application fragment 304 and the second application fragment 305.

A single application management strategy can be applied to pre-empt or prevent occurrences of mismatched approaches, which are multiple methods of a variety of sub-systems having conflicting effects in an overall system. The single application management strategy provides a single coordination to ensure resources are available for use.

For example, the occurrences can include resource leakage, resource collision, resource starvation, application priority deadlock, namespace conflict, cross-thread run-time synchronization failure, and cross-thread communication disconnect. As a specific example, the resource leakage occurs when applications do not use the circuitry resources allocated to them. As another specific example, the resource collision occurs when multiple devices or processes access the same instances of the circuit resources.

As another specific example, the resource starvation occurs when the resources are not allocated for execution of a subsequent process because they are used for execution of a prior process having a higher priority than the subsequent process. As another specific example, the application deadlock occurs when two or more processes are simultaneously waiting for each other to relinquish particular circuit resources.

Application logic that is not able to be fit or implemented in a single instance of the reconfigurable hardware devices 202 can require application synchronization at device input ports of each of the reconfigurable hardware devices 202 that are used to implement and execute the application logic. Multiple approaches to the application synchronization can be supported assuming orthogonal application domains, which are groups of applications that are different and operate independently from each other.

The number of the first application fragment 304 and the second application fragment 305 that can coexist in the computing system 100 as long as there is available uncommitted logic to implement them and therefore can share the same system resources including a memory control interface (not shown) and a network control interface (not shown). Consistency of the application synchronization that applies the same terms and protocols can promote application independence and therefore scalability.

Figure 4:
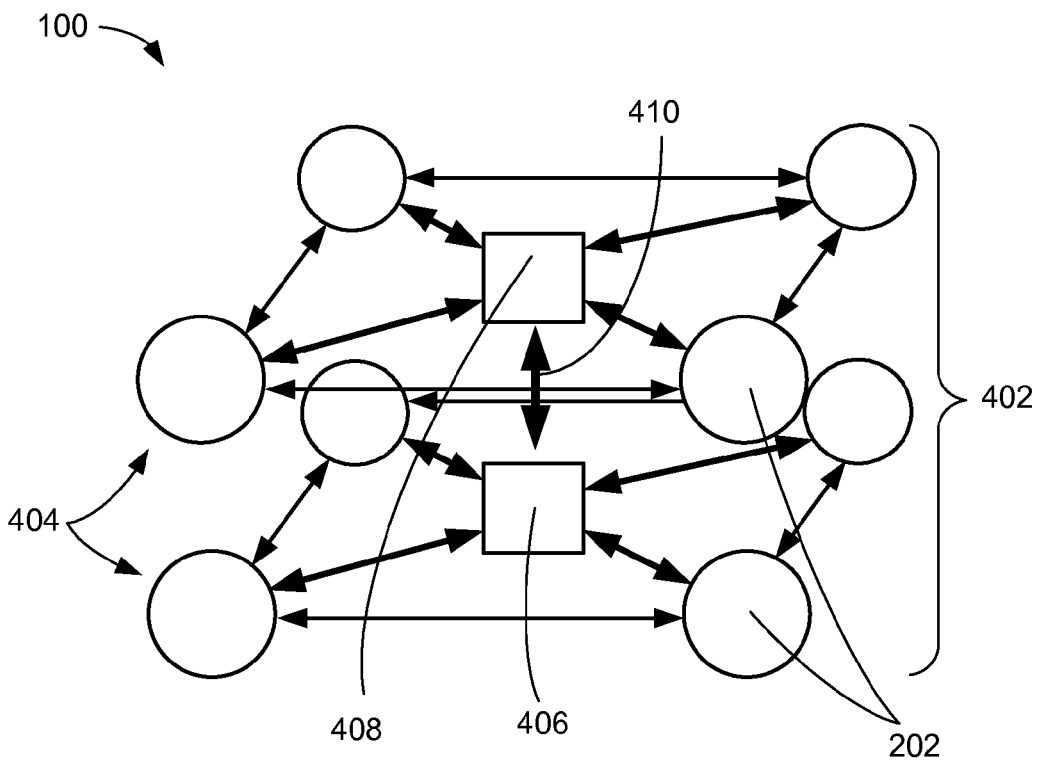
FIG. 4 is a connection diagram of a tandem kernel of the computing system.

Referring now to FIG. 4, therein is shown a connection diagram of a tandem kernel 402 of the computing system 100. The tandem kernel 402 is defined as more than one of clusters 404 connected together.

Each of the clusters 404 is defined as a collection of the reconfigurable hardware devices 202 connected to a first kernel unit 406 or a second kernel unit 408, whereby the reconfigurable hardware devices 202 are locally located with respect to one another. The term "locally located" refers to the reconfigurable hardware devices 202 within the predetermined distance 306 of FIG. 3 from one another and can include coupling through a communication structure 410. The computing system 100 can include a number of the clusters 404 connected together through a number of the first kernel units 406. Each of the first kernel units 406 is defined as a management hardware that includes application management, communication, and synchronization functionality.

The connection diagram depicts the tandem kernel 402 having the first kernel unit 406 connected to a second kernel unit 408, with each of the first kernel unit 406 and the second kernel unit 408 having four instances of the reconfigurable hardware devices 202. Within the tandem kernel 402, one of the reconfigurable hardware devices 202 of the first kernel unit 406 can interface with one of the reconfigurable hardware devices 202 of the second kernel unit 408.

One of the reconfigurable hardware devices 202 can interface with another of the reconfigurable hardware devices 202 within one of the clusters 404 preferably through the first kernel unit 406 or the second kernel unit 408, to which they are attached, of the one of the clusters 404. Optionally, one of the reconfigurable hardware devices 202 of one of the clusters 404 can interface directly with another of the reconfigurable hardware devices 202 within the same one of the clusters 404. Any interconnections between the reconfigurable hardware devices 202 can represent portions of the cross-connection network 301 of FIG. 3.

It has been discovered that each of the clusters 404, having one of the first kernel unit 406 or the second kernel unit 408, provides improved dynamic allocation of hardware resources because the first application fragment 304 of FIG. 3 can be fragmented, mapped, and executed within any number of the circuit resources of the reconfigurable hardware devices 202 managed by the first kernel unit 406 or the second kernel unit 408.

It has also been discovered that any number of the reconfigurable hardware devices 202 can directly interface with each other within one of the clusters 404 in order to provide improved performance with less delays through direct connections while providing reduced cost and complexity.

It is understood that the configuration having four of the reconfigurable hardware devices 202 cross-connected with the first kernel unit 406 or the second kernel unit 408 is an example of the adaptive architecture execution environment (AAXE) and any number of the reconfigurable hardware devices 202 can be so coupled. It is further understood that the coupling of the first kernel unit 406 and the second kernel unit 408 through the communication structure 410 is an example and additional kernel units may be so coupled.

Figure 5:
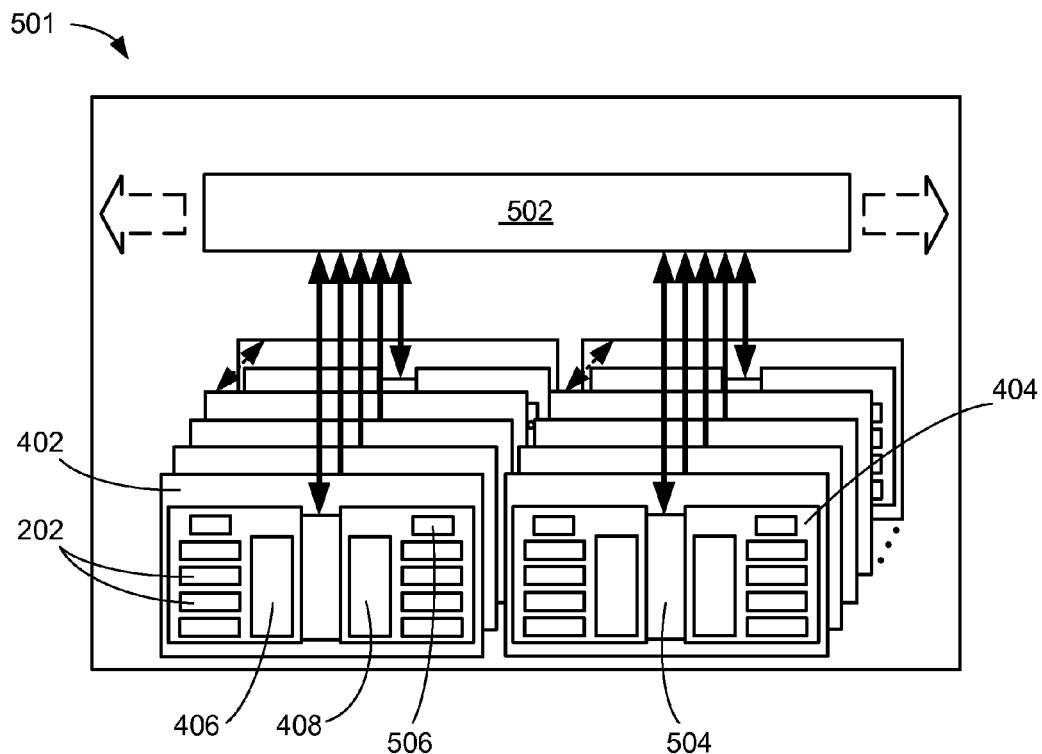
FIG. 5 is a hardware block diagram of the computing system.

Referring now to FIG. 5, therein is shown a hardware block diagram of the computing system 501. The computing system 501 includes a hardware platform having a number of the tandem kernel 402 implemented on printed circuit boards. The computing system 501 can include a number of the first kernel unit 406, the second kernel unit 408, the reconfigurable hardware devices 202, and a communication network 502 that can be engaged and interworking.

The computing system 501 includes a dynamic reconfigurable computing platform without any application software utilization during real-time operation. For example, the computing system 501 can provide a complete hardware compute platform for implementing the first application fragment 304 of FIG. 3, the second application fragment 305 of FIG. 3, or a combination thereof.

The communication network 502 provides an interface and connectivity for the tandem kernel 402 to communicate with another of the tandem kernel 402. The communication network 502 can include switches and communication protocols for sending information and data between one of the first kernel unit 406 of the tandem kernel 402 to one of the first kernel unit 406 of another of the tandem kernel 402. It is understood that communication network 502 can provide a communicative coupling between any of the reconfigurable hardware devices 202 coupled to any of the first kernel unit 406 or the second kernel unit 408 on any of the tandem kernel 402.

The tandem kernel 402 can include a communication interface 504 to provide a cohesive communication between the tandem kernel 402 and another of the tandem kernel 402. For example, the communication interface 504 can represent a network interface.

The communication interface 504 can be used for one of the kernel units 406 of the tandem kernel 402 to communicate with one of the kernel units 406 of another of the tandem kernel 402 through the communication network 502. The communication network 502, the communication interface 504, a number of the kernel units 406, or a combination thereof can represent portions of the cross-connection structure 302 of FIG. 3. For example, a number of the tandem kernel 402 can be included on a number of the line cards 112 of FIG. 1. Also for example, a number of the tandem kernel 402 can represent the first electronic equipment 102 of FIG. 1, the second electronic equipment 104 of FIG. 1, or the third electronic equipment 108 of FIG. 1.

The computing system 501 can accommodate a number of different models of the reconfigurable hardware devices 202, each of which can include different input/output (I/O) densities and different computing resources. Suitability of the reconfigurable hardware devices 202 can depend on an application descriptor 506, which is defined as information regarding the make-up of the first application fragment 304 or the second application fragment 305 that determines how the circuit resources of the reconfigurable hardware devices 202 are to be allocated for implementing them. The application descriptor 506 may comprise resource requirements for implementing the first application fragment 304 and the second application fragment 305.

The application descriptor 506 can include the operation feature including input/output-intensive (I/O-intensive) or compute-intensive. For example, the application descriptor 506 can be used to determine a mix of the circuit resources of the reconfigurable hardware devices 202 committed to the first application fragment 304 and the second application fragment 305.

I/O-intensive refers to the first application fragment 304 that is preferably mapped to the reconfigurable hardware devices 202, which can support a high I/O activity. The high I/O activity refers to a number of input and output ports of a programmable hardware resource greater than a predefined numerical value of input and output ports. For example, the predefined numerical value of input and output ports can be 600. Also for example, I/O-intensive can represent I/O-heavy or high I/O density.

Compute-intensive refers to the first application fragment 304 that is preferably mapped to programmable hardware resources with a high compute resource capacity. Compute-intensive applies to the first application fragment 304 that demands a lot of computation compared to I/O-intensive that requires more input/output operations.

The first application fragment 304 that is I/O-intensive can be placed, routed, and executed more efficiently using a selected model of the reconfigurable hardware devices 202 that is designed for I/O-intensive applications than those for compute-intensive applications. The first application fragment 304 that is compute-intensive can be placed, routed, and executed more efficiently using a different model of the reconfigurable hardware devices 202 that is designed for resource-intensive rather than those for I/O intensive.

The computing system 501 can be tuned or configured by mixing the clusters 404 differently based on the application descriptor 506. The clusters 404 can represent kernel planes. For example, the application descriptor 506 of the first application fragment 304 can be particularly I/O-intensive but the first application fragment 304 has compute-intensive ancillary functionality that is most frequently unused.

In the example above, the clusters 404 populated with high I/O density instances of the reconfigurable hardware devices 202 can be employed for execution of basic functionality of the first application fragment 304. In addition, the clusters 404 populated with compute resource intensive instances of the reconfigurable hardware devices 202 can be employed for execution of the compute-intensive ancillary functionality that is swapped in and out of the compute resource intensive instances of the reconfigurable hardware devices 202.

Each of the clusters 404 can be analyzed to estimate an amount of time for executing a functionality of the first application fragment 304 based on an actual capacity (or size) and an actual I/O density of the reconfigurable hardware devices 202 that are used to map the first application fragment 304. As an application mix of a number of the first application fragment 304 runs in the computing system 501, performance can be measured and a mix of the clusters 404 can be adjusted according to actual run-time characteristics. The application mix refers to the number of the first application fragment 304 that need to be mapped to resources that are I/O-intensive, compute-intensive, or a combination thereof.

Placement of the clusters 404 can depend on the application mix. If an I/O-intensive functionality of the first application fragment 304 is localized in the reconfigurable hardware devices 202, the clusters 404 that are I/O-intensive can be clustered together, thereby decongesting the communication network 502 of the computing system 501. If an I/O-intensive functionality of the first application fragment 304 functions as a hub for a compute-intensive functionality, the clusters 404 that are I/O-intensive can be distributed amongst the clusters 404 that are compute-intensive.

It is understood that the example of the first application fragment 304 was used to focus the discussion, but the second application fragment 305 and any additional number of application fragments can be used. Further it is to be understood that the first application fragment 304 and the second application fragment 305 can represent a portion of an executable application or an entire executable application.

Figure 6:
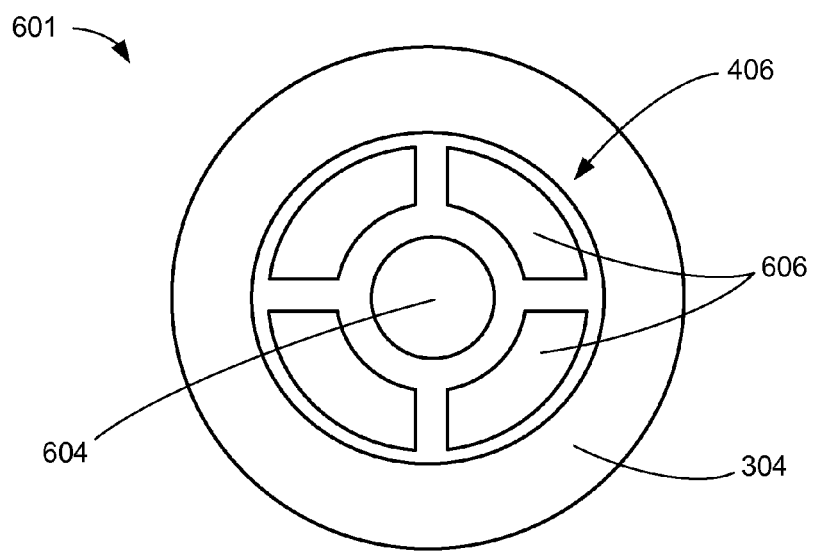
FIG. 6 is an architecture diagram of the application in the computing system.

Referring now to FIG. 6, therein is shown an architecture diagram of the first application fragment 304 in the computing system 601. Each of the first kernel unit 406 can include a microkernel 604 and kernel modules 606. The microkernel 604 can provide control, management, and communication capabilities for each of the first kernel unit 406 to interface with the reconfigurable hardware devices 202 of FIG. 2 to implement and execute functionality of the first application fragment 304.

The kernel modules 606 augments functionality of the microkernel 604 by providing additional control and management capabilities that are not implemented in the microkernel 604. The first kernel unit 406 can be configured for the first application fragment 304 by compiling and synthesizing the kernel modules 606 expressly chosen for an application domain of the first application fragment 304. The first application fragment 304 can be loaded and executed on the circuit resources of the reconfigurable hardware devices 202.

It is understood that the microkernel 604 and the kernel modules 606 are attributes of the first kernel unit 406 and the second kernel unit 408. While the discussion is limited to the first kernel unit, this is done for ease of understanding and is not intended to limit the invention.

The application domain refers to a type of a number of the first application fragment 304 that are based on similar functionalities. The application domain depends on computation that the number of the first application fragment 304 is implemented to execute. For example, the application domain can include encryption, computer vision, and synthetic-aperture radar that can be supported with high-performance computing functionalities implemented in the number of the first application fragment 304.

The first application fragment 304 can be launched in a layer outside each of the first kernel unit 406 having the microkernel 604 and the kernel modules 606. For example, the first application fragment 304 can be developed using a programming language including C++ and VHSIC hardware description language (VHDL) where VHSIC stands for very-high-speed integrated circuits. Also for example, the first application fragment 304 can be developed with Open Computing Language (OpenCL) programs and compiled to run with an execution platform with only hardware using the circuit resources of the reconfigurable hardware devices 202.

The first application fragment 304 can be mapped to and executed by any of the reconfigurable hardware devices 202 that can provide the necessary hardware resources. A process of mapping and implementing a representation or a bitstream of the first application fragment 304 can be managed by each of the kernel units 406 having the microkernel 604 and the kernel modules 606.

Figure 7:
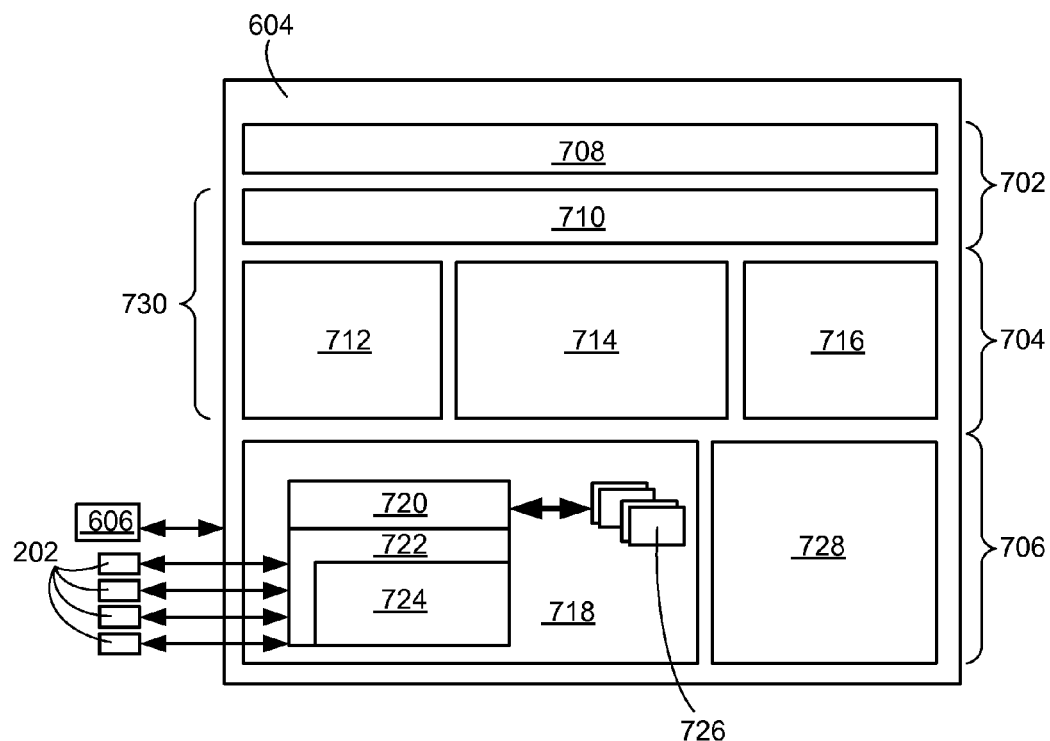
FIG. 7 is a hardware block diagram of the microkernel of FIG. 6.

Referring now to FIG. 7, therein is shown a hardware block diagram of the microkernel 604 of FIG. 6. The microkernel 604 can be implemented with vital functions common to various types of a number of the first application fragment 304 of FIG. 3 that operates in a similar fashion across all application domains. The microkernel 604 does not operate in a stand-alone form but instead with the kernel modules 606.

The microkernel 604 can include operation functions including communications, logic multiplexing, security primitives, job scheduling, and distributed control. The microkernel 604 is an interworking system of sub-functions, organized as shown in FIG. 7. The microkernel 604 can include the sub-functions that are stratified into three layers including a control layer 702, a support layer 704, and a run-time layer 706.

The control layer 702 performs a job control function and includes a microkernel interface (not shown). The control layer 702 can include a user interface unit 708 and an application manager 710 for performing control functions including session management, control plane security, and job scheduling.

The support layer 704 provides scheduling support and network management. The support layer 704 can include a module manager 712, a resource manager 714, and an event manager 716 for performing support functions including scenario validation, event handling, and remote kernel interface management.

The run-time layer 706 provides an application run-time plant. The run-time layer 706 can include run-time blocks including an intra-cluster communication unit 718 having a buffer manager 720 and a virtual bus 722 with a switch fabric 724. The run-time layer 706 can include the run-time blocks including a number of memory devices 726 and an inter-cluster communication unit 728. The run-time layer 706 can include the run-time blocks for performing run-time functions including interfacing with the reconfigurable hardware devices 202 and performing application fragment interconnect, signal management, network interface, and network and application interface security.

The microkernel 604 can include a schedule engine 730 for scheduling portions of a number of the reconfigurable hardware devices 202. The schedule engine 730 can include the application manager 710, the module manager 712, the resource manager 714, and the event manager 716 to support the scheduling.

Sub-blocks of the control layer 702, the support layer 704, and the run-time layer 706 can be connected to each other, the reconfigurable hardware devices 202, and the kernel modules 606. The control layer 702 can interface with the kernel modules 606 and the support layer 704. The support layer 704 can interface with the control layer 702 and the run-time layer 706. The run-time layer 706 can interface with the support layer 704, the reconfigurable hardware devices 202, and the kernel modules 606.

The microkernel 604 can be implemented as a functional foundation for the computing system 100 of FIG. 1, upon which the first application fragment 304 can be built such that the first application fragment 304 is secure, seamless, and able to be independently executed in a multi-threaded environment with others of the first application fragment 304. The microkernel 604 can embody a coherent collection of functionality appropriate hardware for implementing the first application fragment 304.

The microkernel 604 can provide primitives that implement functionality including application module scheduling and maintenance, seamless application fragment interaction, and high-performance application communication. The term "primitives" refers to a collection of simple operations that can be ordered and sequentially executed for executing a relatively more complex operation. For example, the primitives can represent low-level commands that are used to execute relatively high-level operations.

For example, the application module scheduling and maintenance can include thread maintenance and module swapping. Also for example, the seamless application fragment interaction can include interconnection and synchronization.

The thread maintenance monitors instantaneous application needs and regulates allocation of resources to the first application fragment 304. The thread maintenance is performed for multiple applications or processes that can be concurrently executing.

For example, the thread maintenance can monitor the instantaneous application needs of the first application fragment 304 and allocate ancillary logic within the circuit resources of the reconfigurable hardware devices 202 that has been committed to be used by the first application fragment 304. The term "ancillary" refers to uncommitted logic gates that are utilized to implement a function and released to be available to implement another function when the first application fragment 304 has completed and is decimated. Also for example, the thread maintenance can determine that a pipeline stall associated with feedback can require treatment.

The module swapping circumscribes or includes functionality associated with process scheduling including networked database support, identification of appropriate application fragment, run-time application fragment place and route, attachment and registration of application fragment alarms, and intra-application fragment signal handling configuration.

For the seamless application fragment interaction, the microkernel 604 can facilitate run-time synchronization at application grain boundaries including flow-control and management of pipeline stalls involving pipelines that span the application grain boundaries. The term "fragment" refers to a portion of the entire application represented by the first application fragment 304.

The microkernel 604 can also provide for bus interconnection and reliable delivery of application signal information from outputs to fanned-out inputs at application fragment grain boundaries. The application fragment grain boundaries are perimeters of groups of programmable blocks in the reconfigurable hardware devices 202, where interconnects or wires are connected between the groups.

For the high-performance application communication, the microkernel 604 can provide a low-overhead communication infrastructure to the first application fragment 304 developed as any combination of software and hardware on top of or outside the microkernel 604 and the kernel modules 606. Wrappers or interfaces for the first application fragment 304 can be written in hardware or software outside the microkernel 604 and the kernel modules 606 to seamlessly adapt the low-overhead communication infrastructure to a number of protocols.

Figure 8:
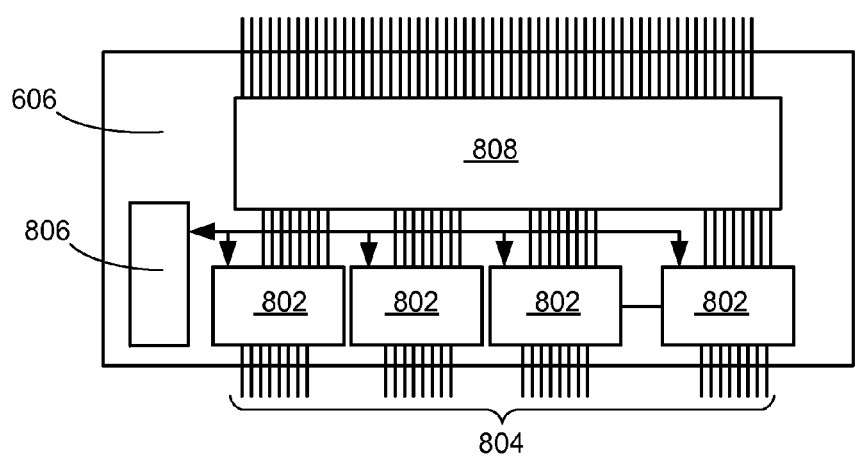
FIG. 8 is an architecture diagram of one of the kernel modules of FIG. 6.

Referring now to FIG. 8, therein is shown an architecture diagram of one of the kernel modules 606 of FIG. 6. The first kernel unit 406 of FIG. 4 and the second kernel unit 408 of FIG. 4, can each include the kernel modules 606 in addition to the microkernel 604 of FIG. 6 in order to provide hardware platform functionality that can spread across a number of the line cards 112 of FIG. 1, the tandem kernel 402 of FIG. 4, the first kernel unit 406, or a combination thereof. The first kernel unit 406 can be shaped or configured to best support the application domain with the kernel modules 606.

Each of the kernel modules 606 can include a microkernel interface block 802. The microkernel interface block 802 provides communication capability for each of the kernel modules 606 to communicate with the microkernel 604 through a kernel expansion bus 804. The kernel expansion bus 804 provides connectivity between the microkernel interface block 802 and the microkernel 604.

The microkernel interface block 802 can support a variety of bus widths and protocols appropriate to functionality of the microkernel 604. Each of the kernel modules 606 can include a security block 806 to monitor a kernel module security status and determine whether each of the first kernel unit 406 operates in a secured mode.

Each of the kernel modules 606 can include an application manager block 808 that interfaces between the microkernel interface block 802 and user logic devices (not shown). The user logic devices are non-kernel logic devices that are implemented outside the first kernel unit 406. The user logic devices can be used to transmit application related information of the first application fragment 304 of FIG. 3 that can be processed by the first kernel unit 406 for authentication, configuration, and management of the reconfigurable hardware devices 202 of FIG. 2. For example, the application manager block 808 can interface with the user logic devices through a communication bus including Peripheral Component Interconnect (PCI) or a system bus on a motherboard or a system board.

The application manager block 808 includes developed supplemental logic to support a number of configuration functionalities. For example, the configuration functionalities can be associated with the policy applied to the concurrent execution of independent instances of the first application fragment 304 including module swapping rules, privilege and authentication rules, scheduling rules, function cache allocation, database management, and managing events and event relationships. Also for example, the configuration functionalities can be associated with interface domain diversity, high-usage application domain functions, issues of waiting logic, and system scalability.

For a specific example, interface domain diversity can imply behavioral sub-classification. In other words, the kernel modules 606 house or include interface functionality based on a sub-classification because different interface domains have different characteristics. For instance, the different characteristics or differentiation can be based on speed and latency. Latency can be affected by inherent equipment constraints or by physical distance between nodes that represent locations of the reconfigurable hardware devices 202.

The kernel modules 606 can be implemented with the functionalities based on application parameters or features that are not implemented in the microkernel 604. For example, the kernel modules 606 can be implemented with functionalities including support for shell programs and file systems.

The microkernel 604 and the kernel modules 606 can be implemented with any number of electronic components including an application-specific integrated circuit (ASIC) or a field-programmable gate array (FPGA). For example, the microkernel 604 and the kernel modules 606 can be implemented with an ASIC, an FPGA, or a combination thereof.

Figure 9:
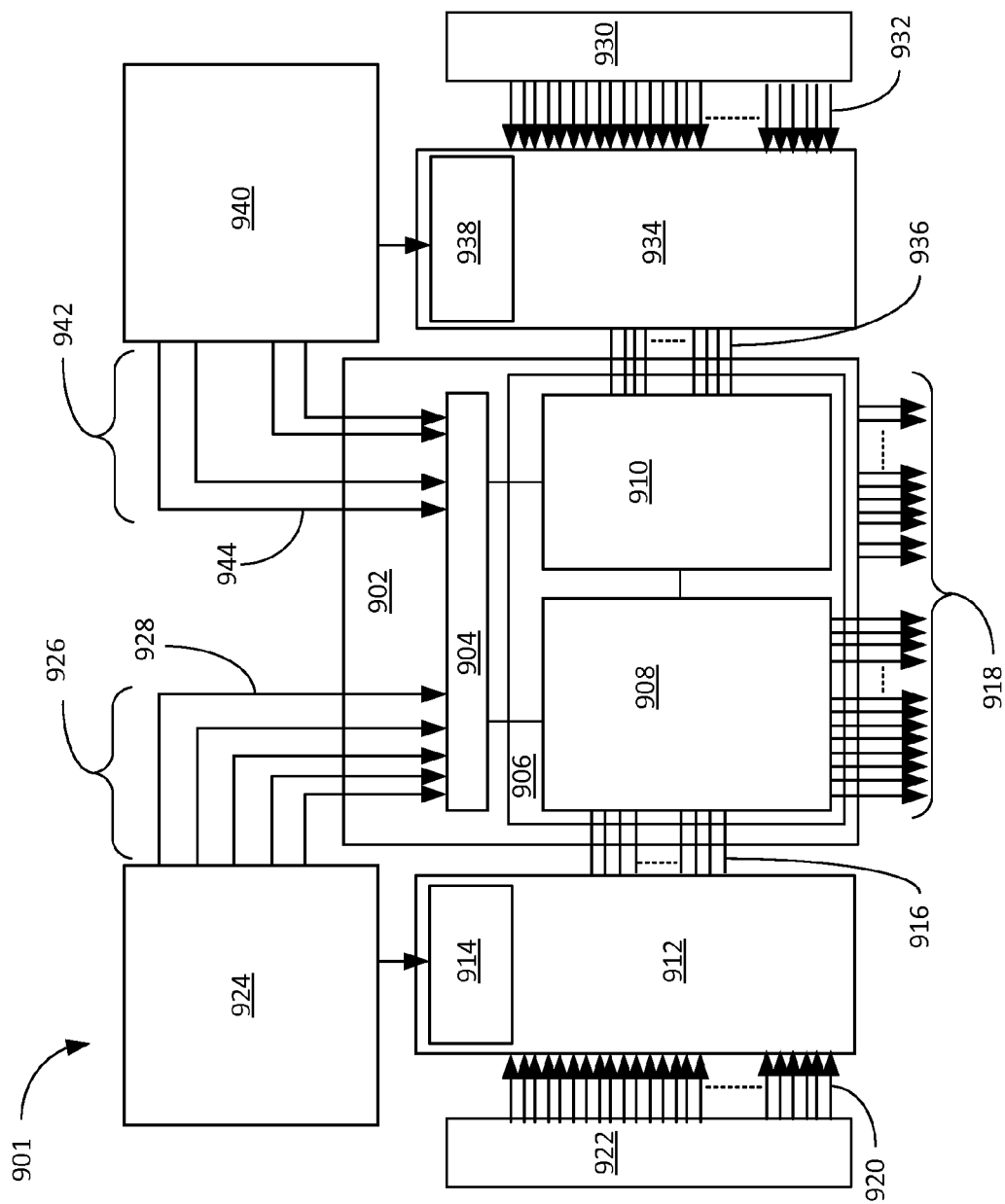
FIG. 9 is a hardware block diagram of a virtual bus module for implementing a virtual bus connection.

Referring now to FIG. 9, therein is shown a hardware block diagram of a virtual bus module 901 for implementing a virtual bus connection. The hardware block diagram of the virtual bus module 901 depicts a flow control module 902 having a routing control module 904. The routing control module 904 can be a register based decoder for managing a cross-point switch 906 having a backpressure cross-point switch 908 and a data available cross-point switch 910.

The term backpressure as used in this application is defined as a state set by down-stream logic, in a sequential-stream of logic that implements an application, to indicate the down-stream logic is temporarily not ready to proceed. The system response to backpressure provides an allocation of memory, register or buffer memory, to maintain the sequential data destined for the down-stream logic. Structures associated with the use of backpressure or in support of the response to backpressure can include backpressure in the element name.

The cross-point switch 906 can be coupled to a backpressure concentrator 912 such as a bank of multiplexers controlled by a backpressure selector 914. The backpressure concentrator 912 can provide a number of synchronization outputs 916 that can be coupled to the backpressure cross-point switch 908 for association with a virtual bus 918. Each of the synchronization outputs 916 can be routed through the cross-point switch 906 for use by the routing control module 904, the flow control module 902, or the virtual bus 918.

The term virtual bus 918 as used in this application is defined to be a variable route hardware interconnect structure that can be instantiated between the first application fragment 304 of FIG. 3 and the second application fragment 305 of FIG. 3 without limiting where in the first application fragment 304 and the second application fragment 305 can be instantiated. It is understood that the virtual bus 918 provides a complete electrical infrastructure for implementing the application 307 of FIG. 3.

It is understood that while a limited number of the synchronization outputs 916 are shown the number of the synchronization outputs 916 actually implemented is only limited by the capacity of the hardware ports available between the backpressure concentrator 912 and the cross-point switch 906. It is further understood that the physical port to port coupling between the backpressure concentrator 912 and the cross-point switch 906 can be logically configured by the routing control module 904 and the backpressure selector 914 to change the application input 920 actually traversing the physical port to port coupling. It is further understood that the logical partitioning of the cross-point switch 906 into the backpressure cross-point switch 908 and the data available cross-point switch 910 is dynamic and can change as provided by the routing control module 904.

An application input network 922 is defined as the physical communication paths traversed by the application input 920 routed throughout the computing system 100 of FIG. 1. The application input network 922 can convey congestion in the down-stream functions of the application 307 of FIG. 3 that requires a temporal dislocation between the up-stream functions and the down-stream functions. The routing of the application input 920 through the backpressure concentrator 912 and the backpressure cross-point switch 908 can be configured by a backpressure management module 924, which can be distributed hardware functions that actually reside within other functional blocks. They are represented as the backpressure management module 924 for clarification of their function.

The backpressure management module 924 can provide a backpressure control bus 926. The backpressure control bus 926 can include control lines or busses that can include add backpressure port, drop backpressure port, clear backpressure, backpressure port vector, and a backpressure port offset 928. The backpressure port offset 928 can be used as an input to the routing control module 904 for adjusting the route through the backpressure cross-point switch 908 for a particular instance of the synchronization outputs 916.

A data available network 930 is defines as the physical communication paths traversed by the data available input 932 routed throughout the computing system 100. It is understood that while the data available network is shown as a block it represents a distributed collection of the physical conductors 204 of FIG. 2 that traverse the computing system 100.

A data available concentrator 934, such as an array of multiplexers can select the data available input 932 in order to provide an enable 936 to the data available cross-point switch 910. A data available selector module 938 can provide the control lines required to make the selection of the data available input 932. The data available selector module 938 can receive input from a data available management module 940. While the data available management module 940 is shown as a single entity, it can represent a distributed hardware function within other sections of the computing system 100.

The data available management module 940 can provide an enable control bus 942, which can include an add enable port, a drop enable port, an enable port vector, and an enable port offset 944. The enable control bus 942 can provide control information to the routing control module 904 for establishing a path through the data available cross-point switch 910 for the enable 936.

It is understood that while all of the output lined of the cross-point switch 906 are indicated as the virtual bus 918, any number of the virtual bus 918 can be provided from the cross-point switch 906. The number of bits and their location can vary for each instance of the virtual bus 918 depending on the type of application that is implemented and the number of the first application fragment 304 of FIG. 3 and the second application fragment 305 of FIG. 3 utilized in the application.

It has been discovered that because the data available input 932 and the application input 920 are buffered in the data available network 930 and the application input network 922, respectively. These buffering capabilities, decouple the outputs from the inputs since the signals are buffered on the way from output to input. The buffers in the data available network 930 and the application input network 922 can be of arbitrary depth and can persist for an arbitrary length of time that must remain less than or equal to the operationally functional time of the system. This allows down-stream logic to be free to utilize the signals at convenience, thus enabling the temporal dislocation. The ability to provide the temporal dislocation allows the first application fragment 304 and the second application fragment 305 to be arbitrarily placed an still maintain synchronous communication between the fragments of the application 307. The arbitrary placement of the first application fragment 304 and the second application fragment 305 can enable the operation of larger applications having many of the application fragments.

It has been discovered that the virtual bus module 901 can provide an interconnect and management structure for joining and coordinating the first application fragment 304 and the second application fragment 305 of the application 307 without regard to the reconfigurable hardware devices 202 in which they are instantiated. It has also been discovered that the virtual bus module 901 can dynamically adjust the synchronous communication between the first application fragment 304 and the second application fragment 305.

Figure 10:
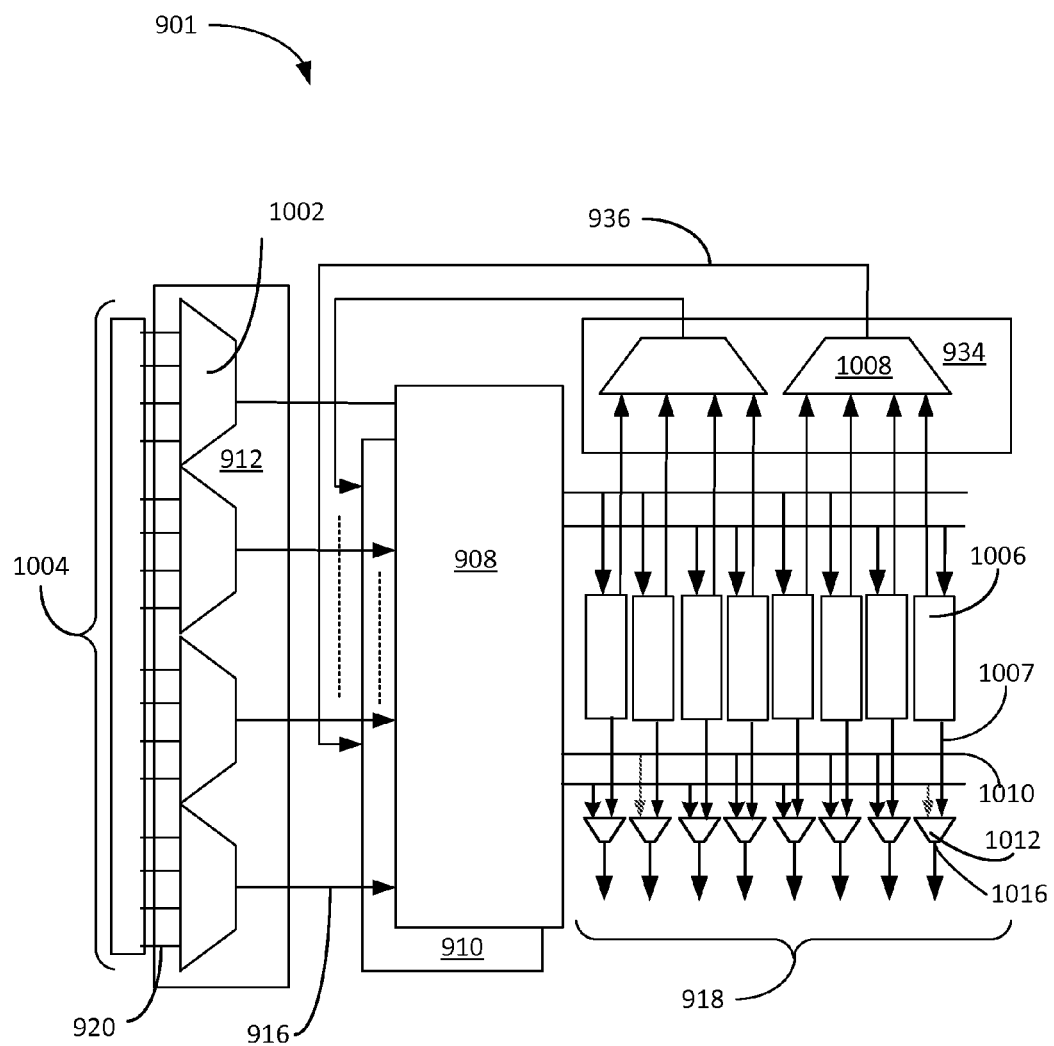
FIG. 10 is a detailed hardware block diagram of the virtual bus module of FIG. 9.

Referring now to FIG. 10, therein is shown a hardware block diagram of the virtual bus module 901 of FIG. 9. The hardware block diagram of the virtual bus module 901 depicts the backpressure cross-point switch 908 receiving the synchronization outputs 916 form the backpressure concentrator 912. An application event multiplexer 1002 in the backpressure concentrator 912 can be coupled to in-line buffers 1004 that receive the application input 920.

While the in-line buffers 1004 are shown as a single block, it is understood that they can be distributed throughout the computing system 100 of FIG. 1. The depth of the in-line buffers 1004 can be determined during the run-time configuration of the target application represented by the first application fragment 304 of FIG. 3 and the second application fragment 305 of FIG. 3.

It is understood that while only four instances of the application event multiplexer 1002 are shown, this is an example only and any number of the application event multiplexer 1002 can be implemented. It is further understood that the number of inputs to each of the application event multiplexer 1002 is an example only and other configurations of the application event multiplexer 1002 can be implemented.

The data available concentrator 934 is shown coupled to application input buffers 1006, such as pin buffers that can provide a synchronous delay in an individual signal pin for maintaining the integrity of the application data 1007. The data available concentrator 934 can contain data available multiplexers 1008 that can select a single input to be gated as the enable 936. The enable 936 can be coupled to the data available cross-point switch 910 for additional routing of the application data 1007.

The enable output 1010 of the data available cross-point switch 910 can be coupled to an enable bus multiplexer 1012 for gating onto the virtual bus 918. The backpressure cross-point switch 908 can provide a backpressure output 1014 coupled to the input of the enable bus multiplexer 1012 for gating onto the virtual bus 918. A physical port 1016 of the enable bus multiplexer 1012 can be coupled to the physical conductors 204 of FIG. 2 in order to implement the virtual bus 918.

It has been discovered that the implementation of the virtual bus 918 can include multiple layers of the application input buffers 1006 in order to provide for time displacement between the input data ready, indicating the up-stream logic has provided the application data, and the destination function being prepared for the application data 1007. The addition of the application input buffers 1006 does not decrease the performance of the hardware executed applications of the computing system 100.

Figure 11:
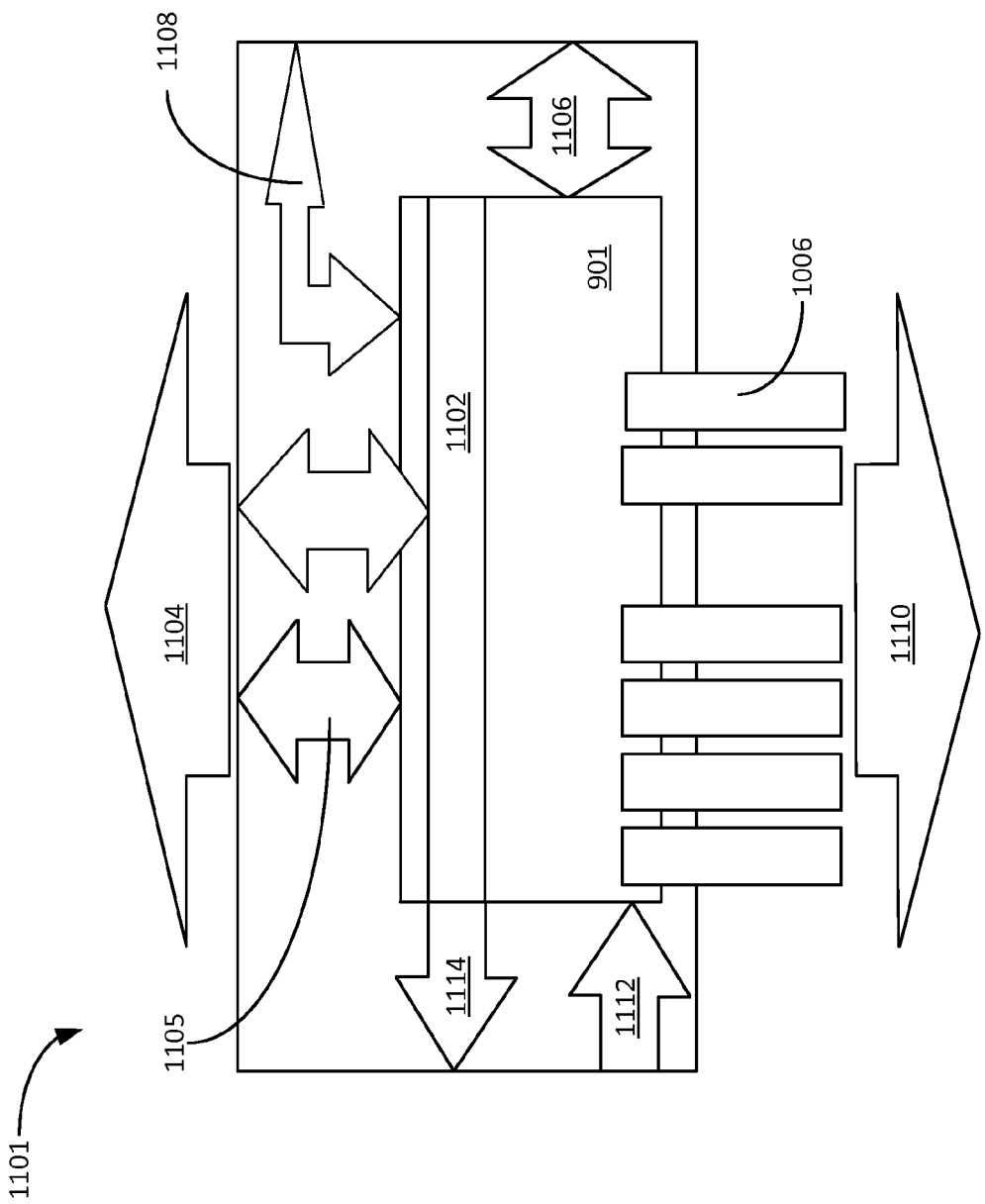
FIG. 11 is a functional block diagram of interfaces of the virtual bus module of FIG. 9.

Referring now to FIG. 11, therein is shown a functional block diagram of interfaces of the virtual bus module of FIG. 9. The functional block diagram of interfaces 1101 depicts the virtual bus module 901 having the application input buffers 1006. The virtual bus module 901 can be closely aligned with a table manager 1102. The application input buffers 1006 can share the application input 920 between the virtual bus module 901 and the table manager 1102.

The virtual bus module 901 can coordinate the application input buffers 1006 as a bus. The table manager 1102 can supply address and command marshaling for managing memory accesses for locking and multi-threaded accesses of a memory interface 1104. The accesses to the memory interface 1104 are split between the requests of the table manager 1102 and the buffer chain accesses 1105 for the virtual bus module 901. The virtual bus module 901 is in the control plane (not shown) and has no direct involvement with the data plane (not shown), so the virtual bus module 901 makes no memory access requests to the memory interface 1104.

The virtual bus module 901 can support a buffer address interface 1106 for monitoring buffer activity to detect any occurrence of overflow or underflow when the virtual bust module is accessing registers of memory for rollback page pointers, head page pointers, or tail page pointers. A second buffer interface 1108 is used by the virtual bus module 901 for pointer access and storage.

The virtual bus module 901 also supports a command interfaces 1110 to the command multiplexer (not shown) for sharing data streams, which can contain user data or application signaling. The command multiplexer (not shown) can also provide configuration data to the virtual bus module 901 through a configuration interface 1112. The virtual bus module 901 can also send messages to the first kernel unit 406 of FIG. 4 by utilizing a table command bus 1114 of the table manager 1102 to execute the exchange.

Figure 12:
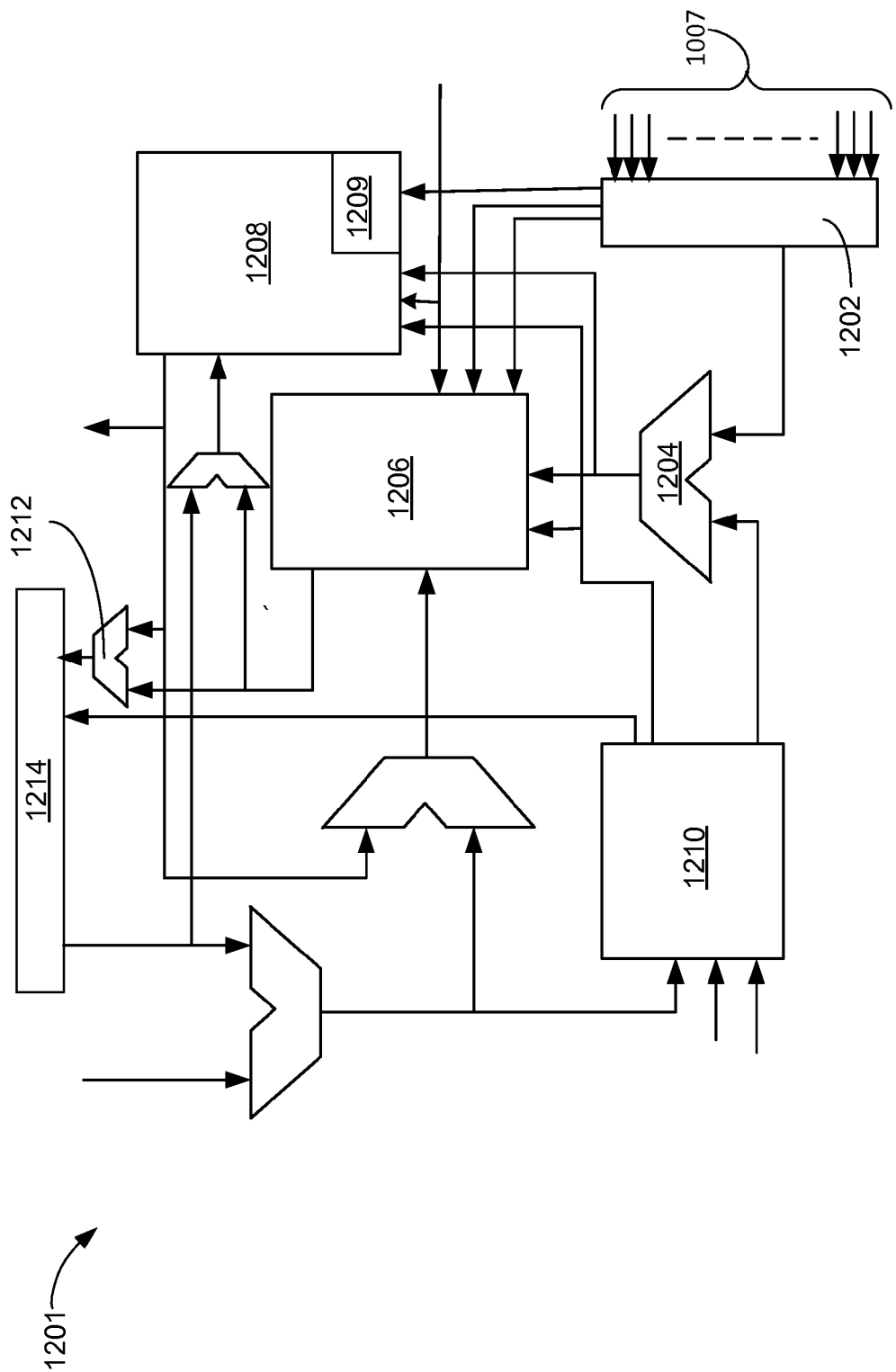
FIG. 12 is a functional block diagram of a signal buffer interface for supporting the virtual bus module of FIG. 9

Referring now to FIG. 12, therein is shown a functional block diagram of a signal buffer interface 1201 for supporting the virtual bus of FIG. 9. The functional block diagram of the signal buffer interface 1201 depicts a pin buffer dispatch module 1202, which receives the execution data of the application 307 of FIG. 3. The pin buffer dispatch module 1202 can act as a virtual pipeline for storing the application data 1007 during the execution of the application 307 should a backpressure event occur.

In some cases the application 307 can have circuitry resources that are allocated but not instantiated, where the instantiation of the circuitry resources can represent fulfillment of the interconnection representing the application 307. During execution of the application 307 some down-stream logic segments can be swapped out either for use by a higher priority application or due to lack of use by the application 307.

During the period when the down-stream logic of the application 307 is unavailable, the virtual bus module 901 of FIG. 1 can activate the signal buffer interface 1201 in response to this backpressure event. The signal buffer interface 1201 can utilize the main system memory (not shown) to store any of the application data 1007 generated by the up-stream logic that is intended for use by the down-stream logic. This invocation can happen automatically in response to the backpressure asserted when the down-stream logic is not ready for the application data 1007.

Each of the pin buffer dispatch module 1202 associates with a particular instantiation of the virtual bus 918 of FIG. 9 by attaching to backpressure and enable signal instances. The application data 1007 content of the application input buffers 1006 of FIG. 10 exists in a list stored in memory that can be accessed by an index of the connection identification number of the particular instance of the virtual bus 918. Associating a physical port 1016 of FIG. 10 to a connection identifier is defined as an offset address established when binding the signal to the physical port 1016 in a virtual bus 918. After a signal is bound to the physical port 1016, the mechanism of the signal buffer interface 1201 can supply addresses for storage and retrieval of partial or complete signal buffers and their starting/ending offsets for each of the instantiations of the virtual bus 918.

The signal buffer interface 1201 can dispatch access requests to a main system memory (not shown) when stimulated to do so by the pin buffer dispatch module 1202. The signal buffer interface 1201 also retires obsolete signal buffers, and performs clean-up functions in the main system memory, when the application 307 terminates its operation. The signal buffer interface 1201 binds the connection identifiers to the physical port 1016 that is part of the virtual bus 918. There is one instance of the signal buffer interface 1201 per a set number of the physical ports 1016.

The pin buffer dispatch module 1202 receives application data from the application input buffers 1006 of FIG. 10. The pin buffer dispatch module 1202 can be coupled to a switch 1204 for passing the application data to a link table module 1206 and a roll-back table module 1208, that are coupled to the switch 1204.

The roll-back table module 1208 can include a roll-back detector 1209, which detects events that impact the storing of the application data 1007. The roll-back detector 1209 can maintain a roll-back threshold, that is established when the virtual bus 918 is instantiated, that can sets the reference beyond which the application data 1007 can be dismissed. The application data 1007 that is eligible for dismissal has exceeded the number of clock cycles that are useable by the application 307 of FIG. 3. The roll-back detector 1209 can also detect a buffer underflow, a buffer overflow, or a queuing event that matches a preset roll-back count. In the event any of these events are detected, the roll-back table module 1208 can restore the main system memory (not shown) to a preset roll-back address and any data that had been transferred is flushed.

A port management module 1210 can be coupled to a second port of the switch 1204. The port management module 1210 can establish or modify an allocation of the main system memory (not shown) for supporting any of the physical port 1016 that the virtual bus 918 has associated. The roll-back table module 1208 can activate a memory request port 1212 for writing or reading the application data 1007 to the main system memory (not shown) The port management module 1210 can directly access a memory interface 1214 for allocation of data space or deletion of obsolete data within the main system memory (not shown).

During operation the pin buffer dispatch module 1202 can detect backpressure through the application input buffer 1006. The backpressure can be caused by congestion in the down-stream logic or the down-stream logic is not instantiated at the time the backpressure was initiated. In an effort to maintain the Application data for further use, the pin buffer dispatch module 1202 can activate the roll-back module 1208 for managing the application data being generated by the up-stream logic during the backpressure.

The roll-back module 1208 can store the application data in the main system memory (not shown) by communicating through a memory interface 1214. The roll-back module 1208 can detect when the application data becomes eligible for dismissal due to completion of the application 307, termination of the application 307, progression of the application 307 to a new task or an alert from the roll-back detector 1209. Once the roll-back module 1208 determines that the data is obsolete, it instructs the memory interface 1214 to delete the application data 1007 that was stored during the backpressure event and it restores the address pointers to a preset value. In the event the roll-back detector 1209 determines the application data 1007 is eligible for dismissal, the application data 1007 that exceeds the roll-back threshold is over-written or dropped.

It has been discovered that the signal buffer interface 1201 can maintain the integrity of application data during a backpressure event without consuming an excessive amount of the main system memory (not shown). It has further been discovered the signal buffer interface 1201 can restore the condition of the main system memory (not shown) to a preset roll-back condition when a roll-back event is detected.

Figure 13:
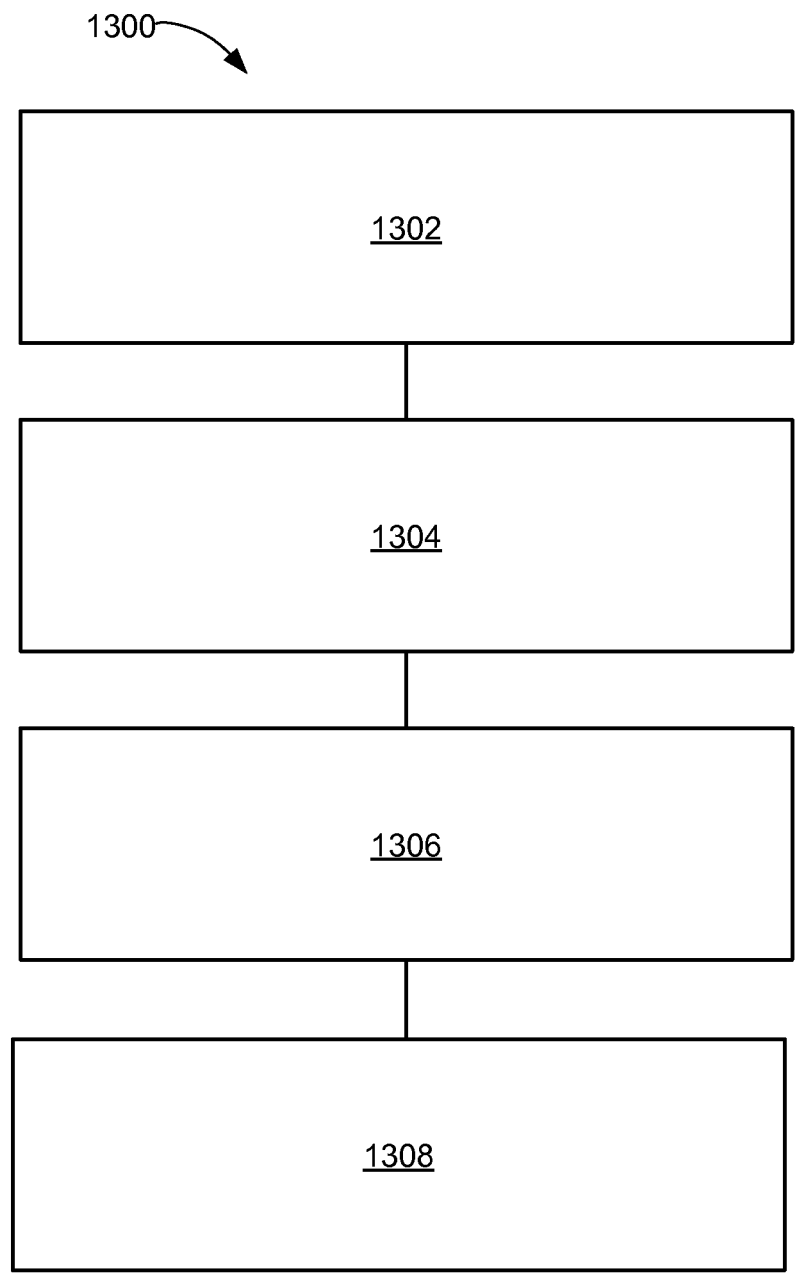
FIG. 13 is a flow chart of a method of operation of the computing system in a further embodiment of the present invention.

Referring now to FIG. 13, therein is shown a flow chart of a method 1300 of operation of a computing system in a further embodiment of the present invention. The method 1300 includes: providing reconfigurable hardware devices having a first application fragment and a second application fragment in a block 1302; configuring a virtual bus module having a virtual bus for electrically coupling the reconfigurable hardware devices in a block 1304; allocating a physical port in the virtual bus based on availability, for communicatively coupling the first application fragment and the second application fragment through the virtual bus in a block 1306; and implementing an application through the virtual bus including transferring application data between the first application fragment and the second application fragment in a block 1308.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of operation of a computing system comprising:
   configuring a virtual bus module having a virtual bus for electrically coupling reconfigurable hardware devices, the reconfigurable hardware devices having a first application fragment and a second application fragment;
   allocating a physical port in the virtual bus, based on availability, for communicatively coupling the first application fragment and the second application fragment through the virtual bus;
   implementing an application through the virtual bus including transferring application data between the first application fragment and the second application fragment; and
   activating a signal buffer interface by the virtual bus module including:
      activating a pin buffer dispatch module for storing the application data from an application input buffer,
      activating a memory request port by a roll-back table module, for storing the application data, in response to the pin buffer dispatch module, and
      alerting by a roll-back detector including dismissing the application data that exceeds a roll-back threshold or restoring a memory interface module by the roll-back module.

2. The method as claimed in claim 1 further comprising configuring a cross-point switch coupled to the physical port for associating an application input to the physical port.

3. The method as claimed in claim 1 further comprising:
   managing a flow control logic in the virtual bus module; and
   monitoring a backpressure concentrator by the flow control logic for synchronizing the first application fragment and the second application fragment.

4. The method as claimed in claim 1 further comprising:
   configuring a flow control logic in the virtual bus module;
   coupling a data available concentrator to the flow control logic for generating an enable to the first application fragment, the second application fragment, or a combination thereof; and
   configuring a data available cross-point switch in the flow control logic for directing the enable to the first application fragment, the second application fragment, or the combination thereof.

5. The method as claimed in claim 1 wherein configuring a virtual bus module further comprises:
   configuring a data available cross-point switch having an enable output coupled to the physical port; and
   coupling an application input buffer to the enable output through the data available cross-point switch.

6. A method of operation of a computing system comprising:
   configuring a virtual bus module having a virtual bus for coupling reconfigurable hardware devices through physical conductors, the reconfigurable hardware devices having a first application fragment and a second application fragment, the reconfigurable hardware devices electrically coupled to the physical conductors;
   allocating a physical port in the virtual bus, based on availability, for communicatively coupling the first application fragment and the second application fragment through the virtual bus including saving a roll-back pointer for reconfiguring the virtual bus module if the first application fragment, the second application fragment, or a combination thereof is retired; and
   activating a signal buffer interface by the virtual bus module including:
      activating a pin buffer dispatch module for storing the application data from an application input buffer including configuring a roll-back module,
      activating a memory request port by the roll-back table module, for storing the application data, in response to the pin buffer dispatch module including writing a memory interface module by the roll-back table module, and
      alerting by a roll-back detector including dismissing the application data that exceeds a roll-back threshold or restoring the memory interface by the roll-back table module.

7. The method as claimed in claim 6 further comprising:
   binding a synchronization output to the virtual bus including associating an application input with the physical port; and
   configuring a backpressure cross-point switch coupled to the physical port for binding the synchronization output to the physical port including enabling the application input onto the virtual bus.

8. The method as claimed in claim 6 further comprising:
   managing a flow control logic in the virtual bus module including associating a synchronization output with the virtual bus; and
   monitoring a backpressure concentrator by the flow control logic for synchronizing the first application fragment and the second application fragment by activating a backpressure control bus for configuring the flow control logic.

9. The method as claimed in claim 6 further comprising:
   configuring a flow control logic in the virtual bus module including activating a data available network;
   coupling a data available concentrator to the flow control logic for generating an enable output to the first application fragment, the second application fragment, or a combination thereof including selecting an enable bus multiplexer coupled to the physical conductor; and
   configuring a data available cross-point switch coupled to the flow control logic for directing the enable output to the first application fragment, the second application fragment, or the combination thereof including conditioning a routing control module by loading a backpressure port offset.

10. The method as claimed in claim 6 wherein configuring the virtual bus module further comprises:
    loading a routing control module with an enable port offset for selecting the physical port coupled to the first application fragment or the second application fragment through the physical conductors;
    configuring a data available cross-point switch having an enable output coupled to the physical port including selecting an enable bus multiplexer for the physical port; and
    communicatively coupling an application input to the enable output through a backpressure cross-point switch including loading a backpressure port offset in the routing control.

* * * * *